United States Patent
Tian et al.

(10) Patent No.: US 6,783,700 B2
(45) Date of Patent: Aug. 31, 2004

(54) RED PHOTOLUMINESCENT PHOSPHORS

(75) Inventors: Yongchi Tian, Princeton, NJ (US); Diane Zaremba, Fairless Hills, PA (US); Ian Gregory Hill, Hightstown, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 10/293,313

(22) Filed: Nov. 14, 2002

(65) Prior Publication Data

US 2003/0132422 A1 Jul. 17, 2003

Related U.S. Application Data

(60) Provisional application No. 60/332,979, filed on Nov. 14, 2001.

(51) Int. Cl.$^7$ ............................ C09K 11/56; C09K 11/55
(52) U.S. Cl. ......................... 252/301.4 S; 252/301.4 H; 257/98
(58) Field of Search ..................... 257/98; 252/301.4 S, 252/301.4 H

(56) References Cited

U.S. PATENT DOCUMENTS 4,842,960 A    6/1989   Lindmayer .................. 428/690

OTHER PUBLICATIONS

International Search Report dated Mar. 3, 2003.

*Primary Examiner*—C. Melissa Koslow
(74) *Attorney, Agent, or Firm*—William J. Burke, Esq.

(57) ABSTRACT

A red-emitting strontium-calcium sulfide phosphor doped with europium and a halide. These phosphors are made by combining their insoluble sulfates, adding europium as an activator, firing in hydrogen sulfide to form the corresponding sulfides, adding a halide co-activator and firing in nitrogen. The resulting phosphors can be used with various electroluminescent devices to produce colored or white light.

14 Claims, 1 Drawing Sheet

RED PHOTOLUMINESCENT PHOSPHORS

This application claims the benefit of U.S. Provisional application Ser. No. 60/332,979 filed Nov. 14, 2001.

This invention relates to novel red photoluminescent phosphors and to methods for making them. More particularly, this invention relates to novel red-emitting phosphors in combination with electroluminescent devices.

BACKGROUND OF THE INVENTION

Blue light emitting LEDs emit radiation in the wavelength range of from about 430 to about 480 nanometers (hereinafter nm). When combined with a yellow phosphor, white light of about 6000–8000 K and a color rendering index (CRI) of about 77 is produced.

White light can also be obtained by combining red, green and blue LEDs. However, since different LEDs have different electrical and optical characteristics, e.g., lumen versus lifetime profiles, output light power versus input current curves and resistance versus temperature curves, such combinations fail to deliver light having consistent chromaticity and uniformity. Further, three LEDs require three current regulators, which adds to the cost of making such devices, and the resulting combination is not compact.

Blue LEDs have also been combined with phosphors to convert part of the blue light to red and green light, to produce white light. Suitable phosphors must have a high efficiency of excitation at about 430–480 nm, and a wide chromaticity zone.

Further, phosphors have been combined with other light emitting or electroluminescent devices, such as those using an organic layer that emits light when excited by electrical energy. Phosphors can also be combined with LEDs to convert the color of an LED or other electroluminescent device to a different emission wavelength, as, from blue to red.

Thus suitable red phosphors to combine with electroluminescent devices to change the light emission or chromaticity have been sought.

SUMMARY OF THE INVENTION

The present invention is directed to red strontium-calcium sulfide phosphors having the formula

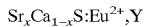

$Sr_xCa_{1-x}S:Eu^{2+},Y$ wherein x is a number of from about 0.3 to 0.8, and Y is one or more halogens, in either their atomic or ionic forms, and to a method for making them. These phosphors have a high quantum efficiency, up to 95%. They are useful to change or convert light from electroluminescent devices to a different emission at various wavelengths.

The host crystal, $Sr_xCa_{1-x}S$, is a solid solution in which the ratio Sr:Ca can be changed arbitrarily. The emission spectrum of the material shifts its peak between 605 and 670 nm with changes in the strontium to calcium ratio.

By combining the present red phosphors with green phosphors and blue LEDs, full color white light can be obtained.

These red phosphors are made by
a) forming a mixture of the sulfate salts of strontium and calcium;
b) adding a solution of europium oxide to the sulfate precipitate;
c) firing the solids to a temperature of about 900° C. in a forming gas atmosphere;
d) firing to a temperature of about 1000° C. in hydrogen sulfide atmosphere to convert the sulfate to the corresponding sulfide;
e) adding an appropriate amount of a halide activator; and
f) firing the mixture of step e) to about 1100° C. in nitrogen atmosphere.

The present phosphors can be efficiently excited by the radiation of a blue light LED or other electroluminescent device to produce a red emission, and can be combined with appropriate phosphors to provide full color white light.

DETAILED DESCRIPTION OF THE INVENTION

Figure 1:
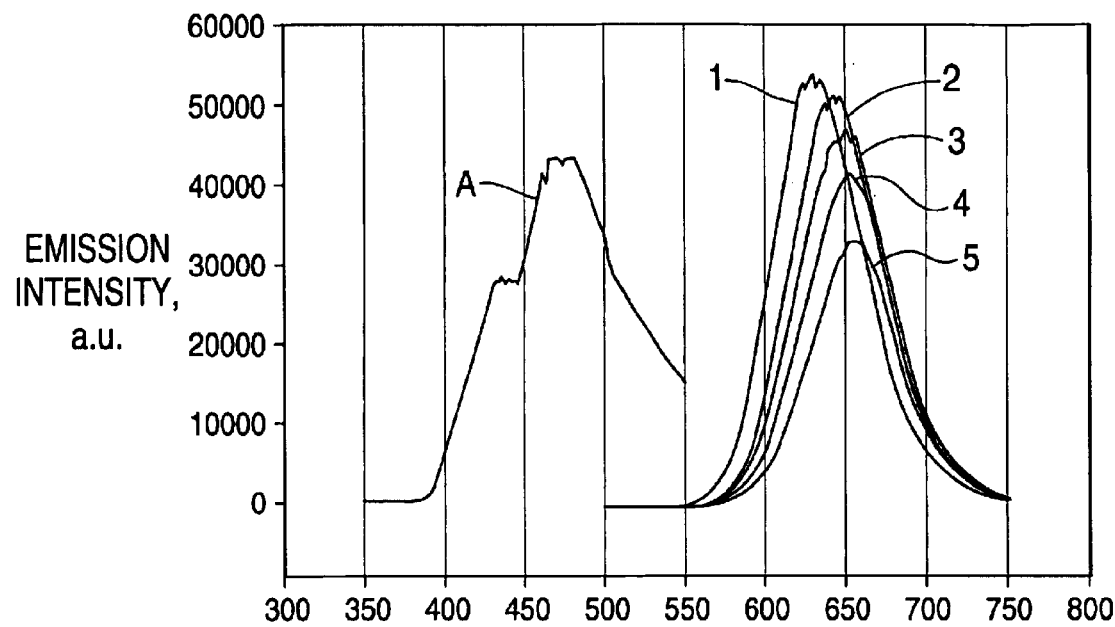
FIG. 1 is a graph of emission intensity versus emission wavelength for the Sr—Ca phosphors of the invention and also shows variations in the excitation spectrum.

The present calcium-strontium sulfide phosphors can be made by combining the desired amounts of calcium and strontium sulfates.

Calcium sulfate can be made by forming a soluble salt solution, such as of calcium carbonate, precipitating the corresponding sulfate salt with sulfuric acid, decanting the liquid, rinsing the sulfate to remove excess acid, and drying the precipitate.

After drying, the calcium and strontium sulfate salts are combined with europium oxide as the activator, dissolved in nitric acid. The activator is slurried with the insoluble sulfate salts and the slurry is dried at about 100° C. for from 12–24 hours.

The mixture is fired in forming gas at a temperature of about 900° C. and held there for about six hours. The solids are then fired in hydrogen sulfide atmosphere to a temperature of about 1000° C. to form the sulfide salts from the sulfate salts. The desired amount of halide, i.e., fluorine, chlorine, bromine and/or iodine, is added and the temperature increased to about 1100° C. in nitrogen. After cooling the phosphor, it can be ground to a powder.

The invention will be further described in the following examples, but the invention is not meant to be limited to the details described therein.

EXAMPLE 1

Part A. Preparation of Calcium Sulfate

Calcium carbonate (300 grams) was stirred with water and nitric acid was added to dissolve the carbonate salt. A slight excess of calcium carbonate was added to provide a solution having a pH of 5 or higher. The resultant calcium nitrate solution was milky in appearance.

1.5 Grams of magnesium metal pieces were cleaned with dilute nitric acid, rinsed, and added to the calcium nitride solution to remove metallic impurities. This mixture was heated to about 85° C. while stirring, and allowed to cool. Stirring can be continued overnight. The solution was filtered until clear.

180 Ml of sulfuric acid was slowly added to the nitrate solution and stirred during precipitation of the calcium sulfate salt. The mixture was stirred for two hours, which can be longer, at a temperature of about 60° C.

The liquid was decanted and the solids rinsed with water until the solids were free of acid. A final rinse with methanol assists in drying the solid, which was carried out in an oven at 100° C. overnight.

Part B. Preparation of a Strontium-Calcium Sulfide Phosphor

Equimolar amounts (4.76 mol) of the calcium sulfate as prepared in Part A and strontium sulfate were combined with europium oxide dissolved in dilute nitric acid and slurried. The resultant solids were ground, oven dried overnight, and ground with a mortar and pestle.

The combined salts were fired first in $N_2/H_2$ (forming gas) in a quartz boat, increasing the temperature at a rate of 15°/min up to about 600° C., held for about 3 hours. The temperature was increased to 900° C. at the same rate and held for about 3 hours. The solids were then ground with a mortar and pestle.

The temperature was increased at a rate of about 20°/min in a hydrogen sulfide atmosphere to 1000° C. and held for 6 hours. The solids were then ground with a mortar and pestle.

A halide dopant such as ammonium chloride was added and fired in a quartz tube, placed in a reverse quartz tube and the temperature increased to 1100° C. at a rate of 20°/min in nitrogen for about one hour. The solids were ground with a mortar and pestle, sieved through a 100 mesh screen and stored under dry conditions.

The resultant phosphor was orange in color, had a powder density of about 4.3–4.8 g/ml, a tunable CIE chromaticity coordinate of x=0.600±0.025 and y=0.350±0.025; a tunable external quantum efficiency of >80%; a tunable emission peak of about 635–645 (broad band); a band width at half height of 68 nm; and an excitation peak of 475 nm.

FIG. 1 is a graph of emission intensity versus wavelength for the phosphor. The excitation spectrum labeled "A" is shown on the left. The emission color changes from yellow to deep red as the strontium:calcium ratio changes from a ratio of about 10 to 0.1. The excitation spectra changes its maximum position to longer wavelength as the calcium content increases.

The emission spectra shown at the right of FIG. 1 shifts from a peak at 618 nm to 655 nm as the calcium content increases. The peak labeled "1" is a phosphor having a Sr:Ca ratio of 0.8:0.2.

The peak labeled "2" is a phosphor having a Sr:Ca ratio of 0.75:0.25.

The peak labeled "3" is a phosphor having a Sr:Ca ratio of 0.50:0.50.

The peak labeled "4" is a phosphor having a Sr:Ca ratio of 0.25:0.75.

The peak labeled "5" is a phosphor having a Sr:Ca ratio of 0.20:0.80.

EXAMPLE 2

The procedure of Example 1 was followed to make a phosphor having the formula $Sr_{0.75}Ca_{0.025}:Eu_{0.075}Cl$.

Figure 2:
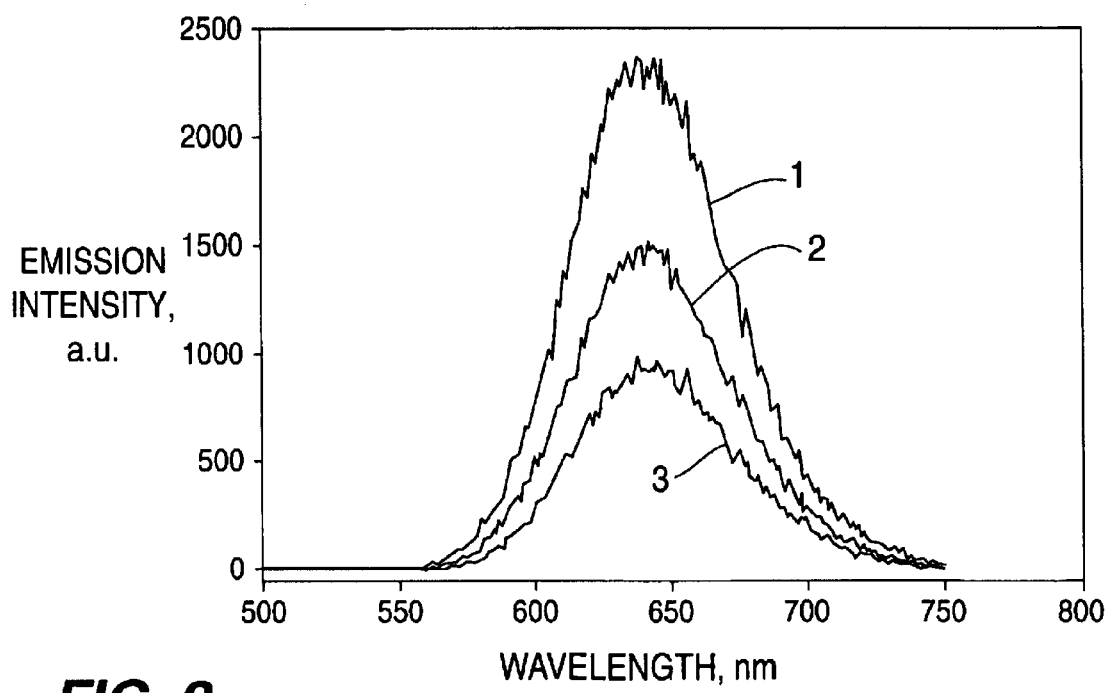
FIG. 2 is a graph of emission intensity versus wavelength of a phosphor of the invention illustrating changes due to varying calcium content.

The chloride content was varied and the effects are shown in FIG. 2.

FIG. 2 is a graph of emission intensity versus wavelength for this phosphor.

The spectra curve labeled "1" is for a phosphor having a chloride content of 1.5%.

The spectra curve labeled "2" is for a phosphor having a chloride content of 0.5%.

The spectra curve labeled "3" is for a phosphor having no chloride.

It can be seen that the emission intensity decreases as the chloride content decreases.

EXAMPLE 3

The procedure of Example 1 was followed to make a phosphor having the formula $Sr_xCa_{1-x}S:Eu^{2+}$, Br, with similar results.

The present phosphors can be used together with blue LEDs, or activated with an ultraviolet light source. The color temperature and color rendering index of the output light can be adjusted by varying the ratio of red, green and blue phosphors. The present phosphors are also useful as the red phosphor for cathode ray tube screens.

The phosphors of the invention can be combined with an adhesive and deposited on the face plate of an LED directly, to convert the blue light of the LED to red light.

The present phosphors can be deposited as a slurry together with an adhesive, the slurry allowed to settle onto the LED and then baking to cure or polymerize the adhesive to adhere the phosphor layer onto the LED. If white light is desired, a green-emitting phosphor will also be added to the blue LED, as is known.

Alternatively, the phosphors of the invention can be mixed with a binder, such as an epoxy, and molded onto the LED by heating to cure the epoxy.

An array of blue LEDs can be used for color displays, combining a blue LED, a blue LED coated with a red phosphor of the invention, and a blue LED coated with a green phosphor.

The present phosphors can also be used in electroluminescent devices using an organic layer as the light emitter. In such case the phosphor is used as a color converting material.

The above LED/phosphor devices can be used where cool light is required, such as for operating table and dentist chair lighting; as overhead lighting, or dome lighting in automobiles, marquis lighting, ddecorative motifs on clothing, backlighting for liquid crystal displays, and other uses when bright but cool lighting is suitable.

Although the invention has been described in terms of particular embodiments, the invention is not meant to be so limited. The invention is only to be limited by the scope of the appended claims.

We claim:

1. A strontium calcium sulfide phosphor comprising $$Sr_xCa_{1-x}S:Eu^{2+}, Y$$

wherein x is an integer of from about 0.3 to about 0.8, and Y is one or more halides in atomic or ionic form.

2. A phosphor according to claim 1 wherein Y is chloride.

3. A phosphor according to claim 1 wherein Y is bromide.

4. A method of making a red-emitting phosphor comprising a) forming a mixture of the sulfate salts of strontium and calcium;

b) adding a solution of europium oxide to the sulfate salts;

c) firing to a temperature of about 900° C. in a forming gas atmosphere;

d) firing to a temperature of about 1000° C. in hydrogen sulfide;

e) adding an appropriate amount of a halide; and f) firing to a temperature of about 1100° C. in nitrogen.

5. A method according to claim 4 wherein the calcium sulfate is made by 1) forming a solution of salt of calcium;
2) precipitating the corresponding sulfate salt by adding sulfuric acid to the solution of step 1); and
3) decanting the liquid, rinsing the sulfate salt to remove excess acid and drying the precipitate.

6. A method according to claim 5 wherein said soluble salt is a carbonate.

7. A method according to claim 4 wherein said halide is chlorine.

8. A method according to claim 4 wherein said halide is bromine.

9. A light source comprising:
   a blue light emitting diode;
   a strontium calcium sulfide phosphor comprising

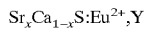
   $Sr_xCa_{1-x}S:Eu^{2+},Y$ wherein x is an integer of from about 0.3 to about 0.8, and Y is one or more halides in atomic or ionic form; and
   wherein the strontium calcium sulfide phosphor is positioned so as to alter the light spectrum of light emitted by the diode.

10. The light source of claim 9, wherein the strontium calcium sulfide phosphor comprises a layer.

11. The light source of claim 10, the layer further comprising a green emitting phosphor effective as to alter the light spectrum of light emitted by the diode.

12. The light source of claim 11, wherein the layer is effective to convert the light emitted by the diode to white light.

13. The light source of claim 9, further comprising:
    green emitting phosphor positioned so as to alter the light spectrum of light emitted by the diode.

14. The light source of claim 13, wherein the strontium calcium sulfide phosphor and the green emitting phosphor are effective to convert the light emitted by the diode to white light.

* * * * *